United States Patent [19]

Nakayama et al.

[11] Patent Number: 4,633,444

[45] Date of Patent: Dec. 30, 1986

[54] SWITCH CIRCUIT PROVIDED WITH MEANS FOR SETTING UP THE INITIAL CONDITION THEREOF

[75] Inventors: Koichi Nakayama, Saitama; Yoshito Tanaka, Kawagoe, both of Japan

[73] Assignee: Toko, Inc., Tokyo, Japan

[21] Appl. No.: 537,825

[22] Filed: Sep. 30, 1983

[30] Foreign Application Priority Data

Oct. 6, 1982 [JP] Japan ............................ 57-151811[U]
Jan. 18, 1983 [JP] Japan ............................. 58-5028[U]

[51] Int. Cl.$^4$ ............................................. G11C 11/40
[52] U.S. Cl. ................................................... 365/228
[58] Field of Search ................ 365/226, 227, 228, 229

[56] References Cited

U.S. PATENT DOCUMENTS 4,218,764  8/1980  Furuta et al. ...................... 365/228

Primary Examiner—James W. Moffitt

[57] ABSTRACT

In a switch circuit, there are provided a signal input stage comprising an array of switches paired with pilot lamps; a storage circuit comprising $I^2L$ elements for storing a signal derived from the signal input stage; a circuit for causing that one of the pilot lamps be lit which is associated with a predetermined one of the switches; electronic switches for controlling a signal source in response to the signal derived from the signal input stage; an auxiliary current source circuit for holding the memory at the storage circuit when the main power supply is interrupted; and a circuit adapted, when the capacity of the auxiliary current source circuit is decreased and when the main power is supplied, to turn on a predetermined one of the switches while turning off the remaining ones of the switches, thereby setting the storage circuit to a predetermined initial condition.

7 Claims, 8 Drawing Figures

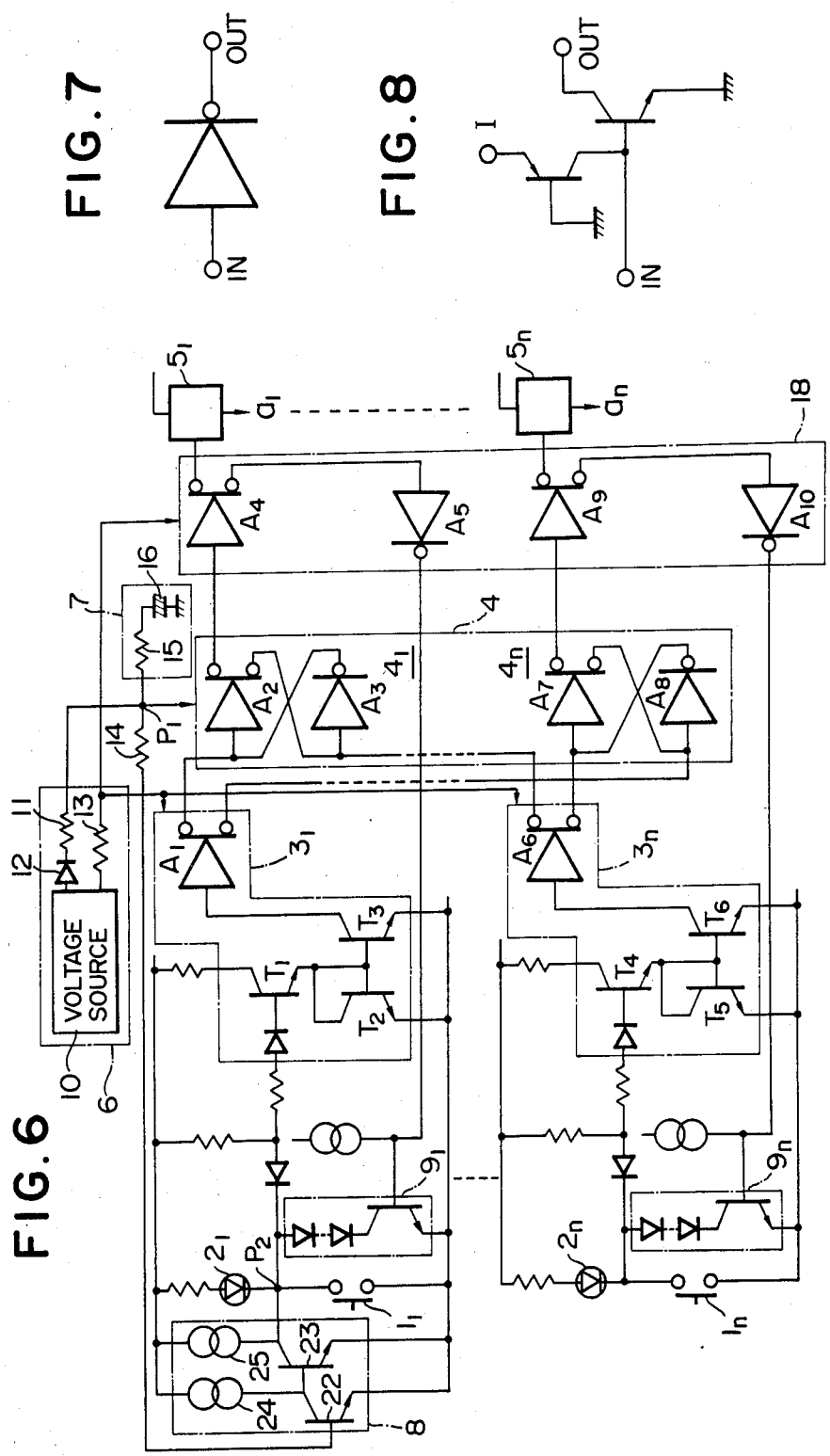

SWITCH CIRCUIT PROVIDED WITH MEANS FOR SETTING UP THE INITIAL CONDITION THEREOF

BACKGROUND OF THE INVENTION

Field of the Invention

This invention relates to a switch circuit which is arranged to be opened and closed by transmitting signals from switches to electronic switches such as analog switches or the like through a control circuit. More particularly, the present invention pertains to a switch circuit equipped with the function of setting up the initial condition of switches when main power is supplied.

Recently, there has been developed a switch circuit comprising an integral combination of push-button switches and a semiconductor integrated circuit for storing signals from the push-button switches and actuating electronic switches to control a signal source. Commonly, such push-button switches comprise self-restore type contacts and are paired with pilot lamps. The switch circuit includes a signal input stage which comprises an array of plural such switches, wherein when a given one of the switches is turned on, the remaining switches are turned off. The switch circuit also includes an auxiliary circuit which is arranged, when the main power supply is interrupted, to enable a storage circuit to hold the memory of a preset condition so that the latter is available when the main power supply is restored.

However, the foregoing conventional switch circuit is disadvantageous in that when main power is supplied or when interruption of the main power supply persists for a long time, there is the tendency that the memory at the storage circuit is cleared; if the main power is supplied under such a condition, an unspecific one of the switches tends to be turned on so that an unstable set condition occurs.

SUMMARY OF THE INVENTION

Accordingly, it is a primary object of the present invention to provide a switch circuit which is so designed as to be restored to a predetermined set condition when main power is supplied.

Another object of the present invention is to provide a switch circuit which is so designed that even if main power supply is temporarily interrupted, the switches of the circuit are restored to the condition set prior to the interruption of the main power supply as long as the memory of the condition set by the switches of the circuit is held, whereas when the memory vanishes, the switches of the circuit are restored to a predetermined initial condition.

Still another object of the present invention is to provide a switch circuit including a circuit means for setting up an initial condition by shorting the contacts of a predetermined one of switches provided therein.

Briefly, according to the present invention, there is provided a switch circuit which comprises:
a signal input stage comprising an array of switches paired with pilot lamps;
a storage circuit comprising I²L elements for storing a a signal derived from the signal input stage;
means for causing that one of the pilot lamps to be lit which is associated with a predetermined one of the switches;
electronic switches for controlling a signal source in response to the signal derived from the signal input stage; and
means comprising an auxiliary current source circuit for enabling the storage circuit to hold its memory when main power supply is interrupted, said means being adapted to turn on a predetermined one of the switches, while turning off the remaining switches when the main power is supplied in the case where the capacity of the auxiliary current source circuit is decreased, thereby setting the storage circuit to a predetermined initial condition.

With the switch circuit according to the present invention, the possibility is precluded that an unspecific one of the switches is turned on when the main power is supplied, thus achieving an enhanced reliability.

Other objects, features and advantages of the present invention will become apparent from the ensuing description taken in conjunction with the accompanying drawings.

BRIEF DESCRIPTION OF THE DRAWINGS

FIG. 6 is a circuit diagram showing an example of the switch circuit shown in FIG. 3.

FIG. 7 illustrates a symbolic mark of a I²L element, and

FIG. 8 shows an equivalent circuit of such an element.

DESCRIPTION OF THE PREFERRED EMBODIMENTS

The switch circuit according to the present invention will now be described with reference to FIGS. 1 to 6.

Figure 1:
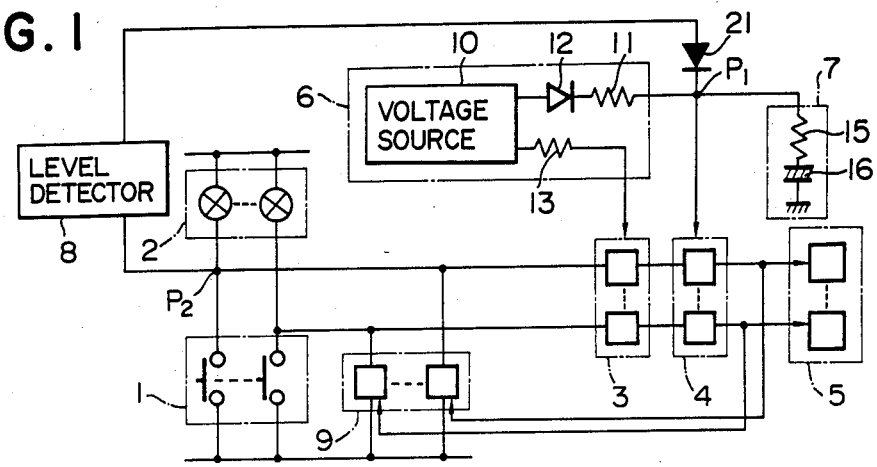
FIG. 1 is a block diagram useful for explaining the switch circuit according to an embodiment of the present invention.

Referring to FIG. 1, there is shown, in a block diagram, the switch circuit according to a first embodiment of the present invention, which comprises a signal input stage constituted by a switch array 1 including a plurality of switches each having a self-restore type contact, and a pilot lamp array 2; and a control circuit circuit constituted by a detector circuit 3, storage circuit 4 and drive circuit 9 which are constructed in the form an integrated circuit. A signal derived from the switch array 1 is converted in the detector circuit 3 to a pulse which in turn is passed to be stored in the storage circuit 4, the output of which is passed to open and close analog switches 5 and also to the drive circuit 9 so that a pilot lamp of the pilot lamp array 2 is lit and kept in the lit state. Part of the detector circuit 3, and storage circuit 4 are constituted by I²L elements. A current source circuit 6 is provided from which an injector current is injected into the I²L elements through a diode 12, resistor 11 and resistor 13. An auxiliary current source circuit 7 is also provided which comprises a resistor 15 and a capacitor 16 connected at one end thereof to the resistor and grounded at the other end thereof, wherein a charge current is caused to flow in the capacitor 16 through the resistor 15 when the main power is supplied.

When the main power supply is interrupted, an injector current is injected into the I²L elements constituting the storage circuit 4 and stored therein for a predetermined period of time. A level detecting circuit 8 is provided which is arranged to detect the potential at the charge circuit of the auxiliary current source circuit 7, and also arranged, when the voltage between the terminals of the auxiliary current source circuit 7 drops below a predetermined level, to turn on one of the switches, while at the same time causing the remaining switches to assume a reset condition. It is also possible that without using the level detecting circuit 8, a false signal may be generated at a predetermined one of the switches, thereby setting up the initial condition of the switch array 1. In the storage circuit 4, one of the storage elements which is associated with a desired one of the switches of the switch array 1, is set, and the remaining storage elements are reset by means of a signal derived from the desired switch of the switch array 1. The pilot lamps are lit on the basis of the set condition of the storage circuit 4 so that the analog switch 5 is controlled accordingly.

When main power is supplied, the capacitor 16 constituting the charge circuit of the auxiliary current source circuit 7 is discharged so that the voltage across the capacitor 16 becomes zero. Thereupon, however, the voltage across the capacitor 16 begins to gradually build up as a result of a charge current flowing from the current source circuit 6 therein through the resistor 15. That is, when the main power is supplied, the potential at a connection point $P_2$ associated with one of the switches of the switch array 1 is caused to assume a low level by means of the level detecting circuit 8 so that the predetermined switch is turned on, while the potential at each of the connection points associated with the remaining switches is caused to assume a high level since the remaining switches remain open. In this way, the initial condition of the switch array 1 is set up on the basis of the predetermined order of preference that a predetermined one of the switches of the switch array 1 be turned on while the remaining ones be reset. At this point, a charge current is caused to flow in the capacitor 16 of the auxiliary current source circuit 7 so that the voltage across the capacitor 16 builds up, thus causing the potential at the connection point $P_2$ at the signal input stage to assume the high level; thereupon, it becomes possible that the remaining switches of the switch array 1 may be set. Assuming that the switch array 1 at the signal input stage is set as desired, that the set condition of the switch array 1 is stored in the storage circuit 4, and that the main power supply is interrupted, then an injector current is injected from the auxiliary current source circuit 7 into the storage circuit 4, and the stored contents of the storage circuit 4 is held. In such a state, when main power is supplied, the switch array 1 is set on the basis of the stored contents of the storage circuit 4. In case, due to a long-time interruption of the main power supply, the energy at the auxiliary current source circuit 7 is dissipated so that the stored contents of the storage circuit 4 can no longer be stored, then the set condition of the switch array 1 is cleared. In such a case, when the main power supply is restored, the potential between the contacts of a preset one of the switches of the switch array 1 is shorted, thereby setting up the initial condition of the switch array 1.

Figure 2:
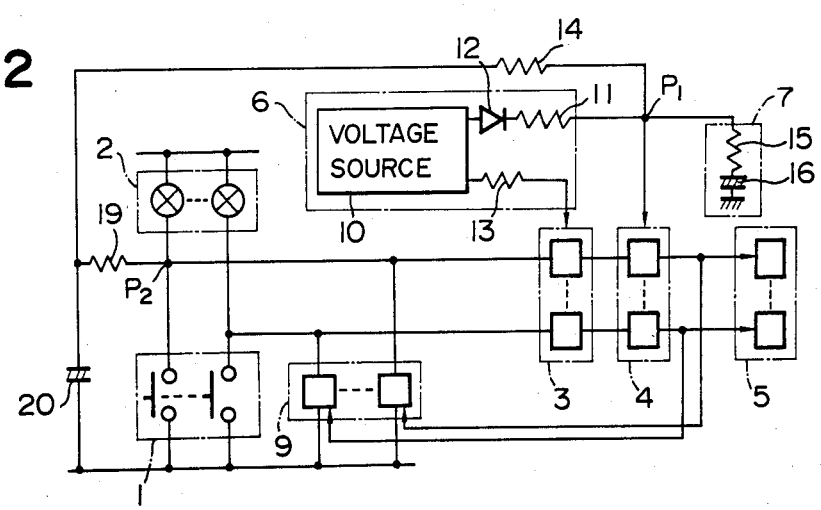
FIG. 2 is a block diagram useful for explaining the switch circuit according to a second embodiment of the present invention.

Referring to FIG. 2, there is shown, in a block diagram, the switch circuit according to a second embodiment of the present invention, which is different from the switch circuit shown in FIG. 1, in that a resistor 14 is connected at one end thereof to the connection point $P_1$ and at the other end thereof to the connection point $P_2$, and the capacitor 20 being grounded at the other end thereof. With the arrangement of FIG. 2, when main power is supplied, a current is caused to flow in the capacitor 20 through the resistor 14 so that a predetermined one of the switches of the switch array 1 is temporarily shorted; thus, the switch array 1 is set to a predetermined initial condition. At this point, a charge current is caused to flow in the capacitor 20 through the resistor 14, and a charge current is also caused to flow, through a resistor 15, in a capacitor 16 which constitutes, together with the resistor 15, an auxiliary current source circuit 7. Consequently, the potential at the connection point $P_1$ becomes high. In such a state, by turning on any one of the switches of a switch array 1, the latter is made to assume a predetermined set condition which in turn is stored in a storage circuit 4; if main power supply is interrupted temporarily, an auxiliary current is supplied from the auxiliary current source circuit 7 to the storage circuit 4, and the contents stored in the latter is held. Under such a condition, if the main power supply is restored, the set condition of the switch array 1 is restored on the basis of the contents stored in the storage circuit 4; as the energy at the auxiliary current source circuit 7 decreases, the switch array 1 is restored to the initial set condition.

Figure 3:
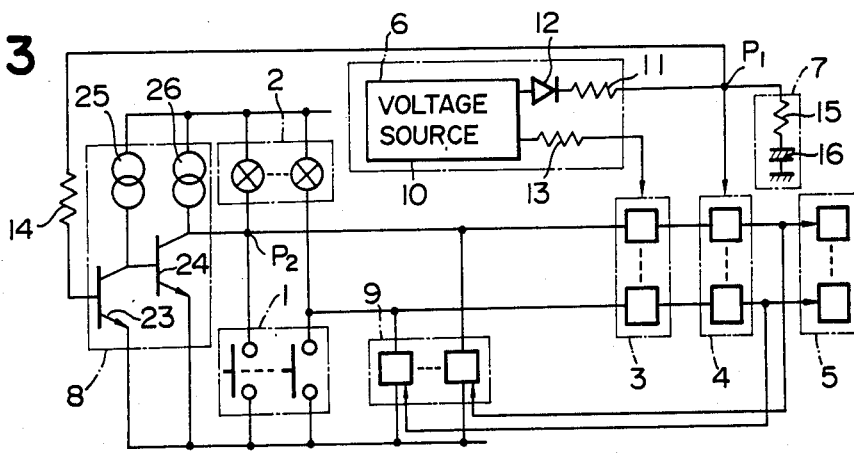
FIG. 3 is a block diagram useful for explaining the switch circuit according to a third embodiment of the present invention.

Referring to FIG. 3, there is shown, in a block diagram, the switch circuit according to a third embodiment of the present invention, which includes a level detecting circuit 8 comprising transistors 23 and 24, and current sources 25 and 26, whereby a predetermined one of the switches of a switch array 1 is shorted to that the initial condition of the switch array 1 is set up. With the arrangement of FIG. 3, in case the energy at the auxiliary current source 7 is low when the main power is supplied, the transistor 23 is in a turned-off state, while the transistor 24 is rendered conductive since it draws in a base current from the current source 25. Thus, the predetermined one of the switches of the switch array 1 is shorted so that a false signal is generated, whereby the predetermined set condition of the switch array 1 is established. When the potential charged at the capacitor 16 exceeds the threshold of the transistor 23, the transistor 24 is turned off so that the switch array 1 can be set to the desired set condition. Under such a set condition, if the main power supply is temporarily interrupted, the set condition of the switch array 1 is held by the storage circuit 4 as long as the auxiliary current source circuit 7 has sufficient energy or capacity; thus, when the main power supply is recovered, the switch array 1 is restored to the set condition. Needless to say, when recovery of the main power supply occurs while the capacity of the auxiliary current source circuit 7 is lowered, the switch array 1 will be restored to the preset initial condition thereof.

Figure 4:
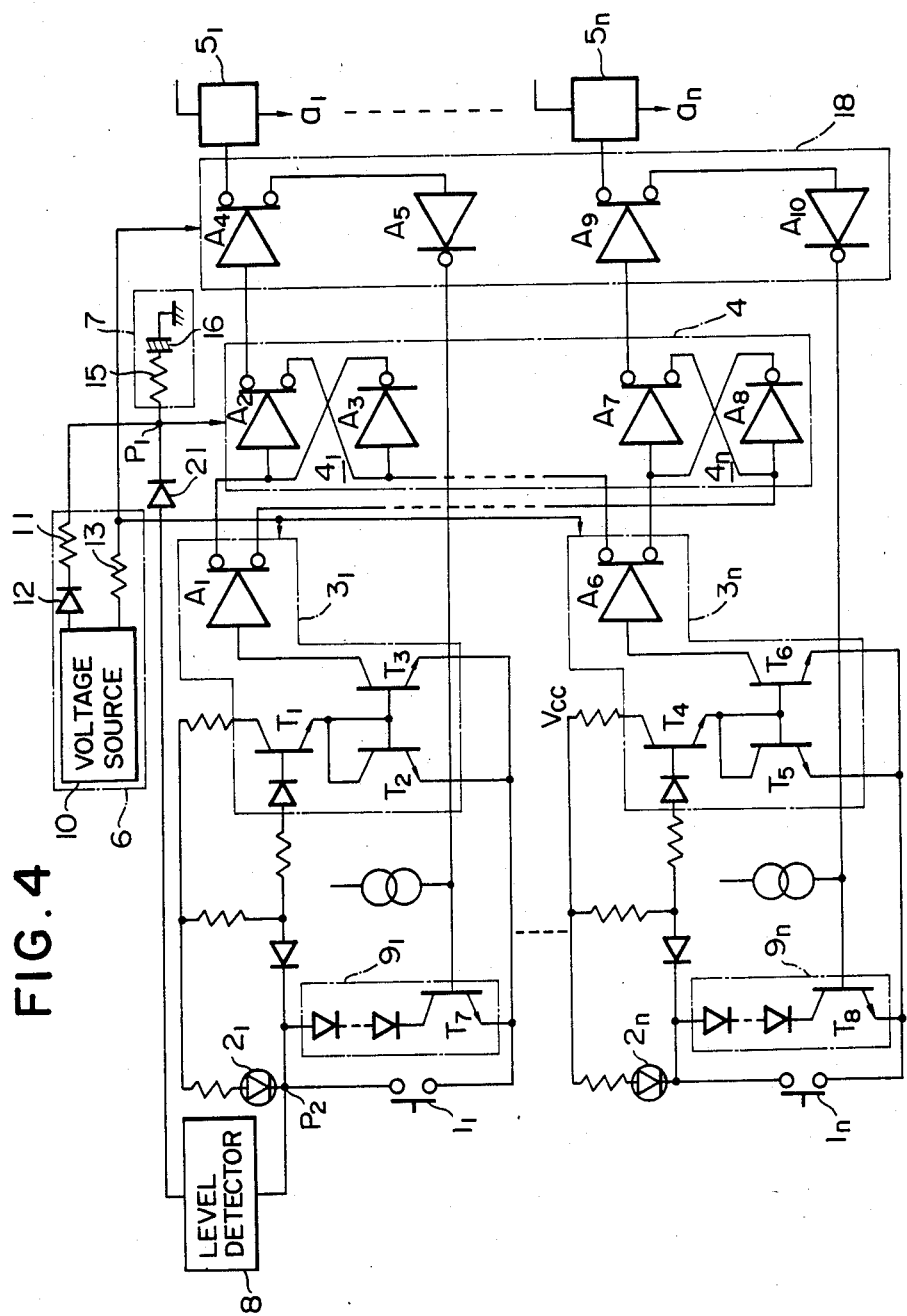
FIG. 4 is a circuit diagram showing an example of the switch circuit shown in FIG. 1.

FIG. 4 is a more concrete circuit diagram illustrating an example of the arrangement shown in the block diagram of FIG. 1.

The circuit of FIG. 4 comprises I²L elements which are commonly represented by such a symbolic mark as shown in FIG. 7 and in the form of an equivalent circuit as shown in FIG. 8, wherein I indicates an injector terminal. As will be seen in FIG. 4, there are provided a signal input stage comprising a series connection of a plurality of switches $1_1$ to $1_n$ each including a self-restore type contact, and light emission diodes $2_1$ to $2_n$; detector circuits $3_1$ to $3_n$, the detector circuit $3_1$ comprising transistors $T_1$, $T_2$ and $T_3$, I²L element $A_1$ and so forth, the remaining detector circuits being similar in construction to $3_1$; and storage circuits $4_1$ to $4_n$, the storage circuit $4_1$ being constituted by a flip-flop (referred to simply as F/F hereinafter) comprising I²L elements $A_2$ and $A_3$, the remaining storage circuits being similar in construction to $4_1$. There are also provided electronic switches $5_1$ to $5_n$, drive circuits $9_1$ to $9_n$, and a signal transmission circuit 18. The signal transmission circuit 18 comprises I²L elements $A_4$, $A_5$, $A_9$ and $A_{10}$, the I²L element $A_4$ having one of the output terminals thereof connected to the electronic switch $5_1$, the other output terminal of the I²L element $A_4$ being coupled to the base of a transistor $T_7$ of the drive circuit $9_1$ through the I²L element $A_5$. The I²L element $A_9$ is also connected in a similar fashion. The electronic switches $5_1$ to $5_n$ may comprise analog switches or the like. Signal sources $a_1$ to $a_n$ are connected to the electronic switches $5_1$ to $5_n$ respectively.

The I²L elements constituting the present switch circuit are supplied with an injector current from the current source 6 which comprises a voltage source circuit 10, and an injector resistor 11, a diode 12 having the cathode thereof connected to one end of the injector resistor 11, and an injector resistor 13. The injector resistor 11 is coupled at the other end thereof to an injector terminal for the I²L elements $A_2$, $A_3$, $A_7$ and $A_8$ which constitute the storage circuit 4, and also to a connection point $P_2$ between a switch $1_1$ and a light emission diode $2_1$ through a diode 21 and level detecting circuit 8. The auxiliary current source circuit 7 is constituted by a resistor 15 and capacitor 16.

For operation of the present switch circuit, main power is first supplied. At this point, the capacitor 16 of the auxiliary current source circuit 7 has been discharged so that the connection point $P_1$ is at a low potential level. Thus, the connection point $P_2$ between the switch 11 and the light emission diode $2_1$ is at an approximately zero potential level, and hence the switch $1_1$ is substantially shorted so that a switch-on signal is passed therethrough to turn off the transistors $T_1$ to $T_3$ of the detector circuit $3_1$. At this point, the potential at the input terminal of the I²L element $A_1$ assumes a high potential level (H level), while the potential at each output terminal of the I²L element $A_1$ assumes a low potential level (L level); thereupon, the F/F $4_n$ is reset. Further, the I²L elements $A_4$ and $A_5$ are successively operated to cause the transistor $T_7$ to be turned on so that the drive circuit $9_1$ is operated, whereby the light emission diode $2_1$ is kept in a lit state. At the same time, the I²L element $A_1$ of the detector circuit $3_1$ is reversed, at its output terminals, from L level to H level, and the capacitor 16 of the auxiliary current source circuit 7 is charged so that the potentials at the connection points $P_1$ and $P_2$ become H level.

By depressing the switch $1_n$, the control circuit is operated so that the light emission diode $2_n$ is lit and kept in the lit state. At the same time, a reset signal is transmitted from the I²L element $A_6$ to the F/F $4_1$, and thus the memory at the F/F $4_1$ is thereby cleared. In this way, when the switch array 1 at the signal input stage is set, the set condition of the switch array 1 is stored in the storage circuit 4. In such a state, if the main power supply is interrupted, then injector current is supplied from the auxiliary current source circuit 7 to the I²L elements of the F/F's $4_1$ to $4_n$ so that the memory at the storage circuit 4 is held. If the interruption of the main power supply persists for a long time, however, the charges at the capacitor 16 becomes insufficient to hold the memory at the storage circuit 4 so that such memory tends to vanish. When the main power supply is restored, the contact of the switch $1_1$ is made, as in the case where the main power is initially supplied, so that the switch array 1 at the signal input stage is set to the initial condition on the basis of the predetermined condition. It is possible that the switch array 1 may comprise transistors.

Figure 5:
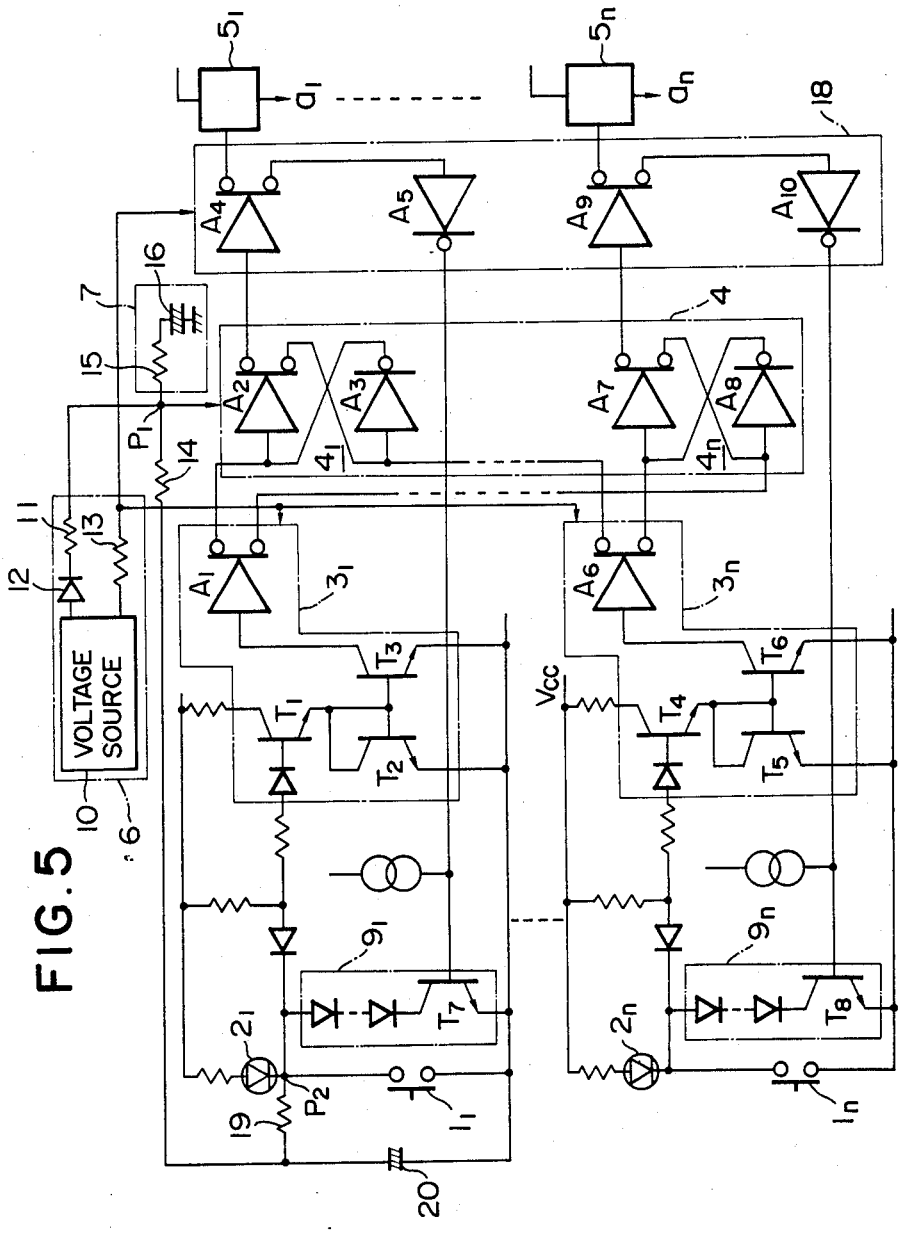
FIG. 5 is a circuit diagram showing an example of the switch circuit shown in FIG. 2.

Referring to FIG. 5, there is shown an example of the arrangement shown in FIG. 2. The control circuit of this embodiment is similar to that of FIG. 4, and therefore further description thereof will be omitted.

With the switch circuit shown in FIG. 5, in case the main power supply is interrupted, injector current is injected into I²L elements constituting a storage circuit 4, and thus the memory at the storage circuit 4 is held. However, the memory at the storage circuit 4 will be cleared if the energy or capacity at the auxiliary current source circuit 7 becomes lower than a predetermined level. In the where the storage circuit 4 is in a cleared state when the main power is supplied, a charge current avalable from a current source circuit 6 is caused to flow into a capacitor 20 through a resistor 14 so that a predetermined switch of the switch array 1 at the signal input stage is shorted between the contacts thereof to be turned on. In this way, the switch array 1 is set to a predetermined condition (initial condition). Pilot lamps 2 and electronic switches 5 are operated on the basis of the operation of the storage circuit 4. As the capacitor 20 is charged, the potential at a connection point $P_2$ builds up to a high level, thus making it possible to set the switch array 1 as desired. By turning on another switch of the switch array 1, the associated one of the pilot lamps 2 is lit, and the switch which was turned on when the main power was supplied, is now turned off. The newly set condition of the switch array 1 is stored in the storage circuit 4. In such a state, if the main power supply is interrupted, a current is injected from the auxiliary current source circuit 7 into the storage circuit 4, and the memory at the storage circuit 4 is held. In case the main power supply is restored while the set condition of the switch array 1 is stored in the storage circuit 4, the pilot lamps 2 and electronic switches 5 are activated on the basis of the set condition of the switch array 1.

FIG. 6 illustrates an example of the arrangement shown in the block diagram of FIG. 3. The control circuit of this embodiment is similar to that of FIG. 4, and therefore further description thereof will be omitted. The level detecting circuit 8 comprises transistors 22 and 23, and current source circuits 24 and 25. When the potential at a point $P_1$ assumes H level, the transistor 22 is turned on, while the transistor 23 is turned off. When the main power is supplied while the potential at the point $P_1$ is at L level, the transistor 23 is now turned on so that a false signal is transmitted to a predetermined one of the switches of the switch array 1.

It is to be understood that the present invention is by no means limited to the circuit arrangements shown in FIGS. 4 to 6. When it is attempted to achieve a desired current amplification rate, several I²L elements may be connected. Alternatively, any of various conventional procedures may be resorted to.

As will be appreciated from the foregoing discussion, with the switch circuit according to the present invention, when the capacitor 16 of the auxiliary current source circuit is at a low potential, or in a discharged state, a predetermined one of the switches is set to "on" state, whereas when the storage circuit is operating, the switch array is restored to the initial condition on the basis of the memory at the storage circuit. Thus, advantageously, the switch circuit according to the present invention is simplified in construction and stabilized in operation in that instability which would otherwise be involved in operation when main power is supplied and/or when the main power supply, which has once been interrupted, is restored, can most effectively be avoided.

While the present invention has been illustrated and described with respect specific embodiments thereof, it is to be understood that the present invention is by no means limited thereto but encompasses all changes and modifications which will become possible within the scope of the appended claims.

What is claimed is:

1. A switch circuit, comprising,
   a signal input stage comprising an array of a plurality of switches;
   a storage circuit for storing a signal derived from said signal input stage;
   means for changing over a signal source on the basis of the memory at said storage circuit; and
   means for causing the terminals of a predetermined one of said switches at said signal input stage to be shorted when main power supply, which has once been interrupted, is restored in the case where the memory at said storage circuit is cleared, so that a signal is generated at said signal input stage, thereby setting a predetermined one of the elements of said storage circuit to cause the remaining ones of the switches to be turned off, while at the same time resetting the remaining ones of the elements of said storage circuit, whereby said storage circuit is placed under an initial condition.

2. A switch circuit according to claim 1, wherein said storage circuit comprises flip-flop circuits constituted by $I^2L$ elements.

3. A switch circuit according to claim 1, wherein said signal input stage includes pilot lamps paired with said plurality of switches.

4. A switch circuit according to claim 1, wherein said means for causing the terminals of the predetermined one of said switches at said signal input stage to be shorted comprises a capacitor.

5. A switch circuit according to claim 1, wherein said means for causing the terminals of the predetermined one of said switches at said signal input stage to be shorted comprises an inverter circuit.

6. A switch circuit, comprising;
   a signal input stage comprising a plurality of switches;
   a control circuit transmitting a signal derived from said signal input stage;
   electronic switches actuatable in response to said signal transmitted by said control circuit;
   a storage circuit comprising $I^2L$ elements for storing a set condition prevailing at said signal input stage; and
   an auxiliary current source circuit for injecting a current into said storage circuit when main power supply is interrupted, said auxiliary current source circuit including a capacitor connected between the terminals of a predetermined one of said switches at said signal input stage, said capacitor being connected at one end thereof to said auxiliary current source circuit through a resistor, wherein in the case where said storage circuit is holding its memory when the main power is supplied, said electronic switches are actuated under a preset condition, whereas in the case where the memory at said storage circuit has been cleared when the main power is supplied, a charge current is caused to flow from a voltage source into said capacitor through said resistor so that a predetermined one of said switches at said signal input stage is turned on, thereby setting the switch circuit to the initial condition.

7. A switch circuit, comprising:
   a signal input stage comprising an array of a plurality of switches each having a self-restore type contact and paired with a pilot lamp;
   a control circuit including a detector circuit comprising $I^2L$ element for detecting a signal derived from said signal input stage, a storage circuit comprising $I^2L$ elements for storing a signal derived from said detector circuit, and a transmission circuit comprising $I^2L$ elements for transmitting a change-over signal to electronic switches in response to a signal derived from said storage circuit, while at the same time transmitting a signal to a drive circuit to cause the pilot lamps to be lit and kept in the lit state;
   a current source circuit for injecting injector current into each of said $I^2L$ elements; and
   an auxiliary current source circuit for injecting injector current into the $I^2L$ elements constituting said storage circuit, wherein when main power is supplied, injector current available from said current source circuit is injected into each of said $I^2L$ elements; when the main power supply is interrupted, injector current available from said auxiliary current source circuit is injected into the $I^2L$ elements constituting said storage circuit to enable said storage circuit to store a condition set by the switches at said signal input stage; when the capacity of said auxiliary current source circuit is decreased as a result of the interruption of the main power supply having persisted for a long time, a signal is transmitted to a predetermined one of the switches at said signal input stage upon restoration of said main power supply, thereby setting the switch circuit to the initial condition.

* * * * *